United States Patent
Baeckler et al.

(10) Patent No.: US 11,301,611 B2
(45) Date of Patent: Apr. 12, 2022

(54) DETERMINISTIC CLUSTERING AND PACKING METHOD FOR RANDOM LOGIC ON PROGRAMMABLE INTEGRATED CIRCUITS

(71) Applicant: Intel Corporation, Santa Clara, CA (US)

(72) Inventors: Gregg William Baeckler, San Jose, CA (US); Martin Langhammer, Alderbury (GB)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 16/720,346

(22) Filed: Dec. 19, 2019

(65) Prior Publication Data

US 2020/0125780 A1    Apr. 23, 2020

(51) Int. Cl.
| | |
|---|---|
| *G06F 30/392* | (2020.01) |
| *G06F 30/327* | (2020.01) |
| *G06F 30/3308* | (2020.01) |
| *G06F 30/394* | (2020.01) |
| *G06F 30/31* | (2020.01) |

(52) U.S. Cl.
CPC .......... *G06F 30/392* (2020.01); *G06F 30/327* (2020.01); *G06F 30/3308* (2020.01); *G06F 30/394* (2020.01); *G06F 30/31* (2020.01)

(58) Field of Classification Search
CPC .................................................. G06F 30/392
USPC ........................................................ 716/134
See application file for complete search history.

(56) References Cited

U.S. PATENT DOCUMENTS

| | | | |
|---|---|---|---|
| 5,995,730 A * | 11/1999 | Blinne | G06F 30/00 716/103 |
| 6,263,483 B1 | 7/2001 | Dupenloup | |
| 6,292,931 B1 | 9/2001 | Dupenloup | |
| 6,295,636 B1 | 9/2001 | Dupenloup | |
| 6,665,851 B1 * | 12/2003 | Donelly | G06F 30/392 716/123 |
| 7,082,584 B2 | 7/2006 | Lahner et al. | |
| 7,380,223 B2 | 5/2008 | Panteleev et al. | |
| 7,904,857 B2 | 3/2011 | Wang et al. | |
| 8,448,122 B1 * | 5/2013 | Suthar | G06F 30/34 716/128 |
| 2009/0219051 A1 | 9/2009 | Zhang et al. | |
| 2018/0101624 A1 * | 4/2018 | Dhar | G06F 30/392 |

* cited by examiner

*Primary Examiner* — Eric D Lee
(74) *Attorney, Agent, or Firm* — Fletcher Yoder, P.C.

(57) ABSTRACT

Methods and apparatus for increasing the random logic utilization on a programmable device are provided. Although not completely homogeneous, the programmable device has many components that are repeated many times in an array. To help improve repeatability and packing, computer-aided design tools for compiling a circuit design for the programmable device may first lock down a synthesis cell netlist with stable naming, create location solution files (files with desired clustering granularity for stabilizing performance and reducing compile times) for selected regions of interest on the programmable device, and compose a final design with only the best solutions some of which can be imported from one location to another. Compiling a design in this way can help improve random logic utilization beyond 85% while improving circuit performance by 20% or more.

18 Claims, 11 Drawing Sheets slack 0.078 ← 802

**QSF set_location_assignment FF_X190_Y9_N52-to
nios_0|_ext_addr_r_0_
set_location_assignment FF_X190_Y10_N5-to
nios_0|_ext_addr_r_1_
set_location_assignment FF_X192_Y10_N49-to
nios_0|_ext_addr_r_2_
set_location_assignment FF_X191_Y9_N50-to
nios_0|_ext_addr_r_3_
set_location_assignment FF_X192_Y11_N59-to
nios_0|_ext_addr_r_4_

**RCF signal_name = nios_0|_sched0_storing {
    LAB_RE:X190Y13S0B:LAB~OUTPUT~LABOUTT[0];
    C3:X190Y10S0139;
    label = Label_LOCAL_INTERCONNECT:X191Y10S0130, LOCAL_INTERCONNECT:X191Y10S0130;
    LAB_RE:X191Y10S0B:LAB~INPUT~LLEIMC0_7;
    dest = (nios_0|_sched0_i144, C0 );

branch_point = Label_LOCAL_INTERCONNECT:X191Y10S0130;
    LAB_RE:X191Y10S0B:LAB~INPUT~LEIMC0_8;
    dest = (nios_0|_sched0_i144,C0);

branch_point = Label_LOCAL_INTERCONNECT:X191Y10S0130;
    LAB_RE:X191Y10S0B:LAB~INPUT~LEIMC1_9;
    dest = (nios_0|_sched0_ext_we_0,C1);
}

FIG. 8

DETERMINISTIC CLUSTERING AND PACKING METHOD FOR RANDOM LOGIC ON PROGRAMMABLE INTEGRATED CIRCUITS

BACKGROUND

This invention relates generally to integrated circuits and, in particular, to ways for improving the design and speed of programmable integrated circuits.

Programmable integrated circuits such as programmable logic devices (PLDs) include configurable logic circuitry having look-up tables (LUTs) and adder based logic that are designed to allow a user to customize the circuitry to the user's particular needs. This configurable logic, which can implement logic gates, multiplexers, or even state machines, is sometimes referred to as "random logic."

Besides random logic, PLDs may also include arithmetic logic such as adders, multipliers, and dot-product circuits. Methods have been developed to increase the utilization of arithmetic logic on a PLD from the typical 70% to close to 99%. Such methods are, however, not applicable to random logic. As a result, device utilization for random logic typically maxes out at around 85%. Any additional "packing" of random logic beyond this limit would decrease device performance, which also varies from one compilation to another even when there is only a small change to the design. In other words, speed is not deterministic, and there is a lot of wasted chip area.

It is within this context that the embodiments described herein arise.

BRIEF DESCRIPTION OF THE DRAWINGS

FIG. 8 is a diagram of an illustrative location solution file for a soft processor core in accordance with an embodiment.

DETAILED DESCRIPTION

The present embodiments relate to a method for achieving deterministic clustering and packing of random logic circuitry on a programmable integrated circuit such as a programmable logic device (PLD) or a field-programmable gate array (FPGA). Methods are described that can increase the random logic utilization from 85% to greater than 90% or greater than 95% while boosting the overall device performance by 20% or more. It will be recognized by one skilled in the art, that the present exemplary embodiments may be practiced without some or all of these specific details. In other instances, well-known operations have not been described in detail in order not to unnecessarily obscure the present embodiments.

Figure 1:
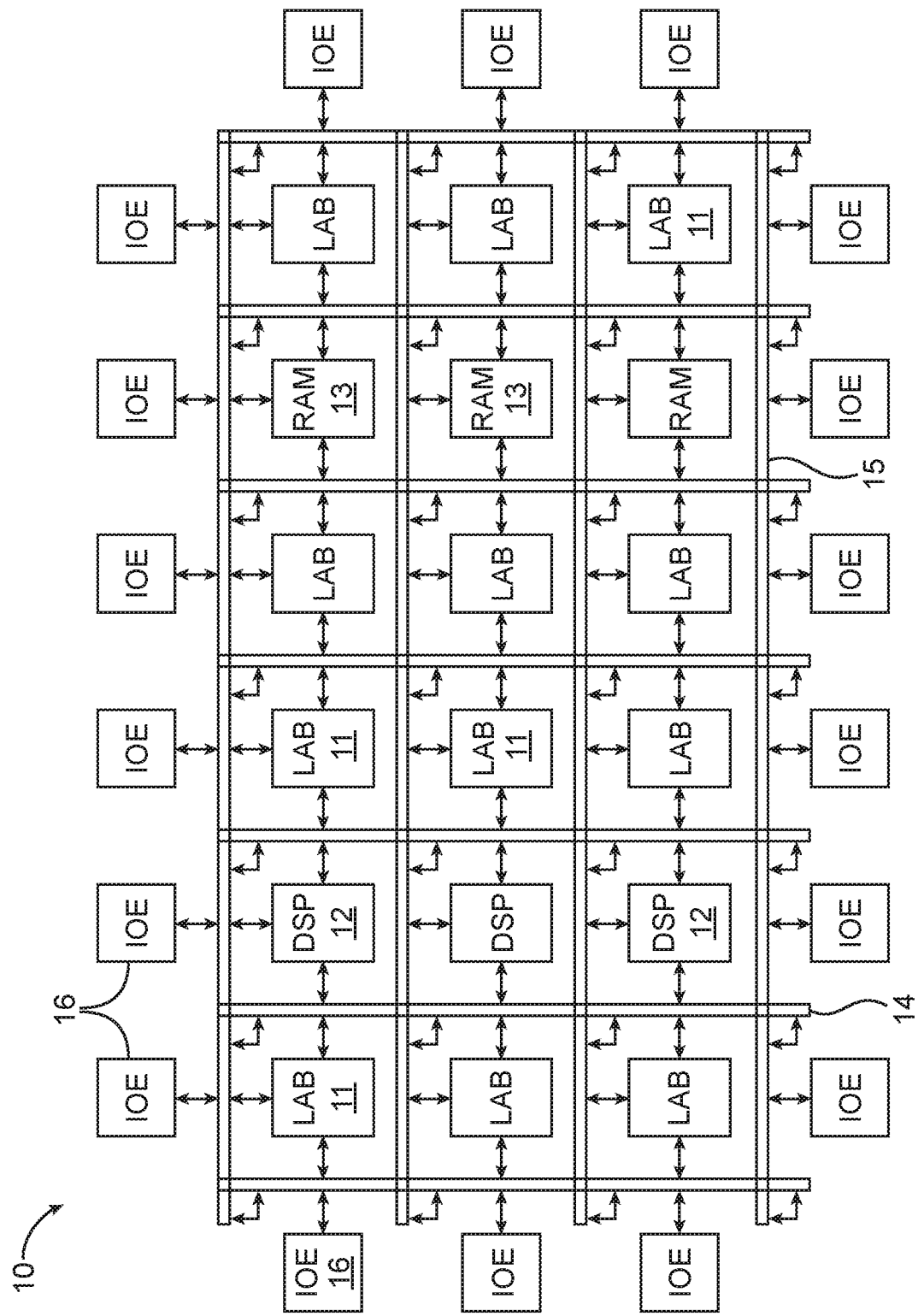
FIG. 1 is a diagram of an illustrative programmable integrated circuit in accordance with an embodiment.

With the foregoing in mind, FIG. 1 is a diagram of a programmable integrated circuit 10 that includes arithmetic logic and random logic. As shown in FIG. 1, programmable logic device 10 may include a two-dimensional array of functional blocks, including logic array blocks (LABs) 11 and other functional blocks, such as random access memory (RAM) blocks 13 and specialized processing blocks such as digital signal processing (DSP) blocks 12 that are partly or fully hardwired to perform one or more specific tasks such as mathematical/arithmetic operations.

Functional blocks such as LABs 11 may include smaller programmable regions (e.g., logic elements, configurable logic blocks, or adaptive logic modules) that receive input signals and perform custom functions on the input signals to produce output signals. Device 10 may further include programmable routing fabric that is used to interconnect LABs 11 with RAM blocks 13 and DSP blocks 12. The combination of the programmable logic and routing fabric is sometimes referred to as "soft" logic, whereas the DSP blocks are sometimes referred to as "hard" logic. The type of hard logic on device 10 is not limited to DSP blocks and may include other types of hard logic. Adders/subtractors, multipliers, dot product computation circuits, and other arithmetic circuits which may or may not be formed as part of a DSP block 12 may sometimes be referred to collectively as "arithmetic logic."

Programmable logic device 10 may contain programmable memory elements for configuring the soft logic. Memory elements may be loaded with configuration data (also called programming data) using input/output elements (IOEs) 16. Once loaded, the memory elements provide corresponding static control signals that control the operation of one or more LABs 11, programmable routing fabric, and optionally DSPs 12 or RAMs 13. In a typical scenario, the outputs of the loaded memory elements are applied to the gates of metal-oxide-semiconductor transistors (e.g., pass transistors) to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc. The logic gates and multiplexers that are part of the soft logic, configurable state machines, or any general logic component not having a single dedicated purpose on device 10 may be referred to collectively as "random logic."

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), programmable metallization cells (PMCs), conductive-bridging RAM (CBRAM), resistive memory elements, combinations of these structures, etc. Because the memory elements are loaded with configuration data during programming, the memory elements are sometimes referred to as configuration memory, configuration RAM (CRAM), configuration memory elements, or programmable memory elements.

In addition, programmable logic device 10 may use input/output elements (IOEs) 16 to drive signals off of device 10 and to receive signals from other devices. Input/output elements 16 may include parallel input/output circuitry, serial data transceiver circuitry, differential receiver and transmitter circuitry, or other circuitry used to connect one integrated circuit to another integrated circuit. As shown, input/output elements 16 may be located around the periphery of the chip. If desired, the programmable logic device may have input/output elements 16 arranged in different ways.

The routing fabric (sometimes referred to as programmable interconnect circuitry) on PLD 10 may be provided in the form of vertical routing channels 14 (i.e., interconnects formed along a vertical axis of PLD 10) and horizontal routing channels 15 (i.e., interconnects formed along a horizontal axis of PLD 10), each routing channel including at least one track to route at least one wire. If desired, routing wires may be shorter than the entire length of the routing channel. A length L wire may span L functional blocks. For example, a length four wire may span four functional blocks. Length four wires in a horizontal routing channel may be referred to as "H4" wires, whereas length four wires in a vertical routing channel may be referred to as "V4" wires.

Furthermore, it should be understood that embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
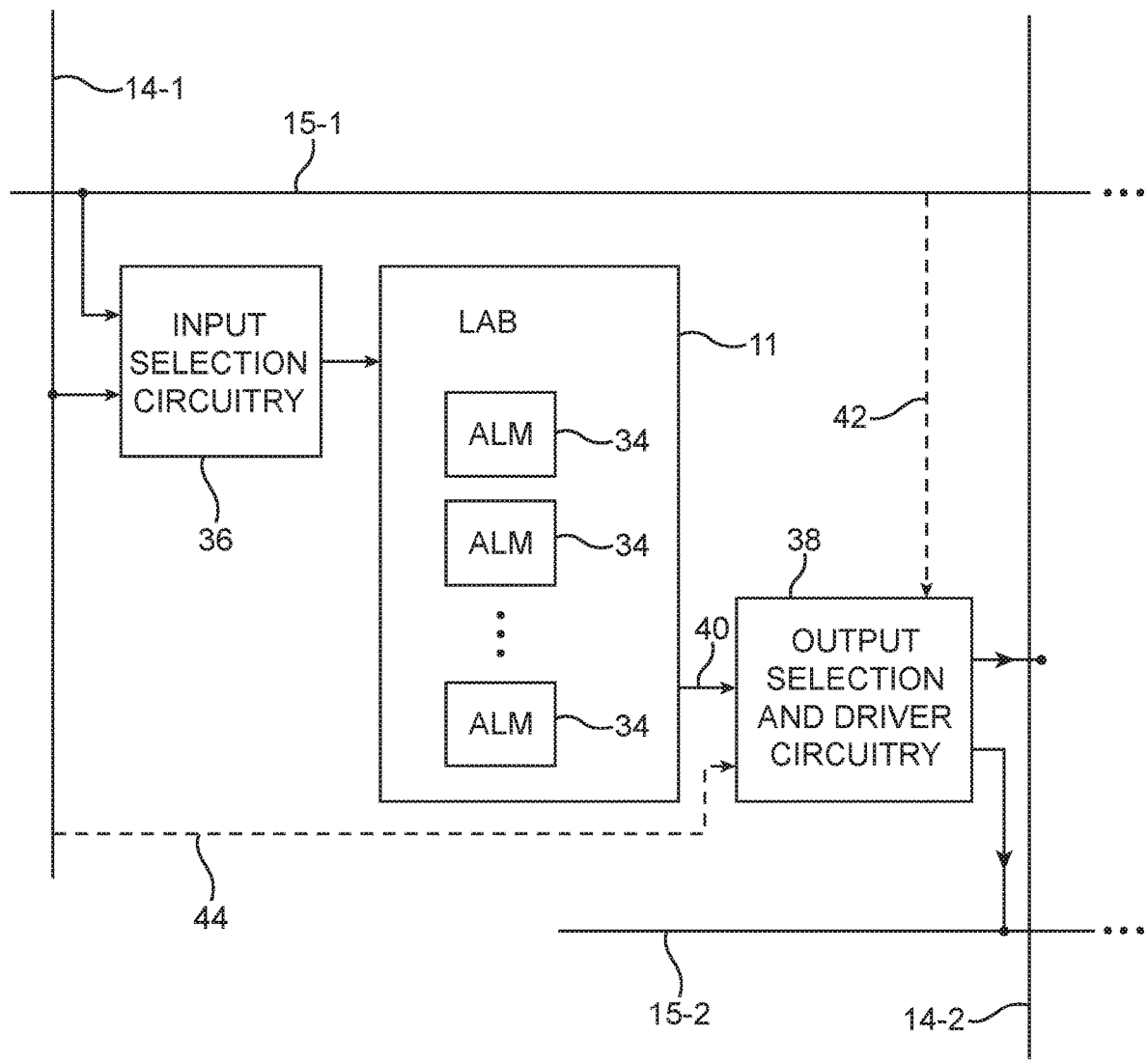
FIG. 2 is a diagram of an illustrative programmable logic block in accordance with an embodiment.

An illustrative programmable logic region 11 including a group of multiple smaller logic regions 34 is shown in FIG. 2. Programmable logic region 11, sometimes referred to as a logic array block (LAB), may have associated input selection circuitry 36 and output selection and driver circuitry 38. Input selection circuitry 36 and output selection and driver circuitry 38 may be formed as part of routing paths 14 and 15 or as part of input-output circuits such as input-output circuits 12 of FIG. 1.

Input selection circuitry 36 may receive input signals via a first set of horizontal interconnects 15-1 and a first set of vertical interconnects 14-1. For example, interconnects 15-1 may provide input signals to programmable logic block 11 from other programmable logic blocks 11 in the same row or from input/output pins 16, whereas interconnects 14-1 may provide input signals to programmable logic block 11 from other logic blocks 11 in the same column or from pins 16. Input selection circuitry 36 may be configured (e.g., by programming CRAM bits that are associated with input selection circuitry 36) to select one or more of the input signals to provide to programmable logic block 11.

As shown in FIG. 2, LAB 11 may include smaller regions of programmable logic 34. The smaller programmable logic regions 34 within each programmable logic region 11 are sometimes referred to as "adaptive logic modules" (ALMS), "logic elements," or "logic cells." Logic cells 34 may receive the input signals that are selected by input selection circuitry 36 and may perform custom functions on the input signals to produce output signals. The input signals received by each logic cell 34 may overlap with input signal portions received by other logic cells 34 (e.g., some of the input signals received by a first logic cell 34 may also be received by a second logic cell 34). There may be any suitable number of logic cells 34 within logic block 11. In general, each logic cell or ALM 34 may be a native element on device 10 that includes a group of lookup table (LUT) circuits and associated registers, which can be collectively configured to implement logic gates or even arithmetic circuits.

The output signals may be provided to output selection and driver circuitry 38 via output paths 40. Output selection and driver circuitry 38 may receive output signals via paths 40 and may be configured to provide the output signals to a second set of horizontal interconnects 15-2 and a second set of vertical interconnects 14-2.

If desired, output selection circuitry 38 may be configured to disconnect one or more of interconnects 15-2 or 14-2 (e.g., by providing no output signal or by providing a high impedance output). If desired, output selection circuitry 38 may be configured to provide a given output signal to multiple interconnects. For example, it may be desirable to route an output signal from a given logic cell 34 to two different regions on integrated circuit 10. In this scenario, output selection and driver circuitry 38 may provide that output signal to two different interconnects of different lengths.

In some arrangements, input selection circuitry 36 may include LAB input multiplexers (LIMB) that can be used to select signals from a horizontal channel, a vertical channel, and local outputs from one or more logic cells 34 and to drive a set of LAB lines. The input selection circuitry 36 may also include logic element input multiplexers (LEIMs) that can be used to select signals from some set of LAB lines and to drive the selected signals to logic cells 34. Output selection circuitry 38 may include driver input multiplexers (DIMs) that can be used to select signals from a horizontal channel, a vertical channel, and local outputs from one or more logic elements and to drive wires, which originate in that logic block 11 and route to other logic blocks 11.

Figure 3:
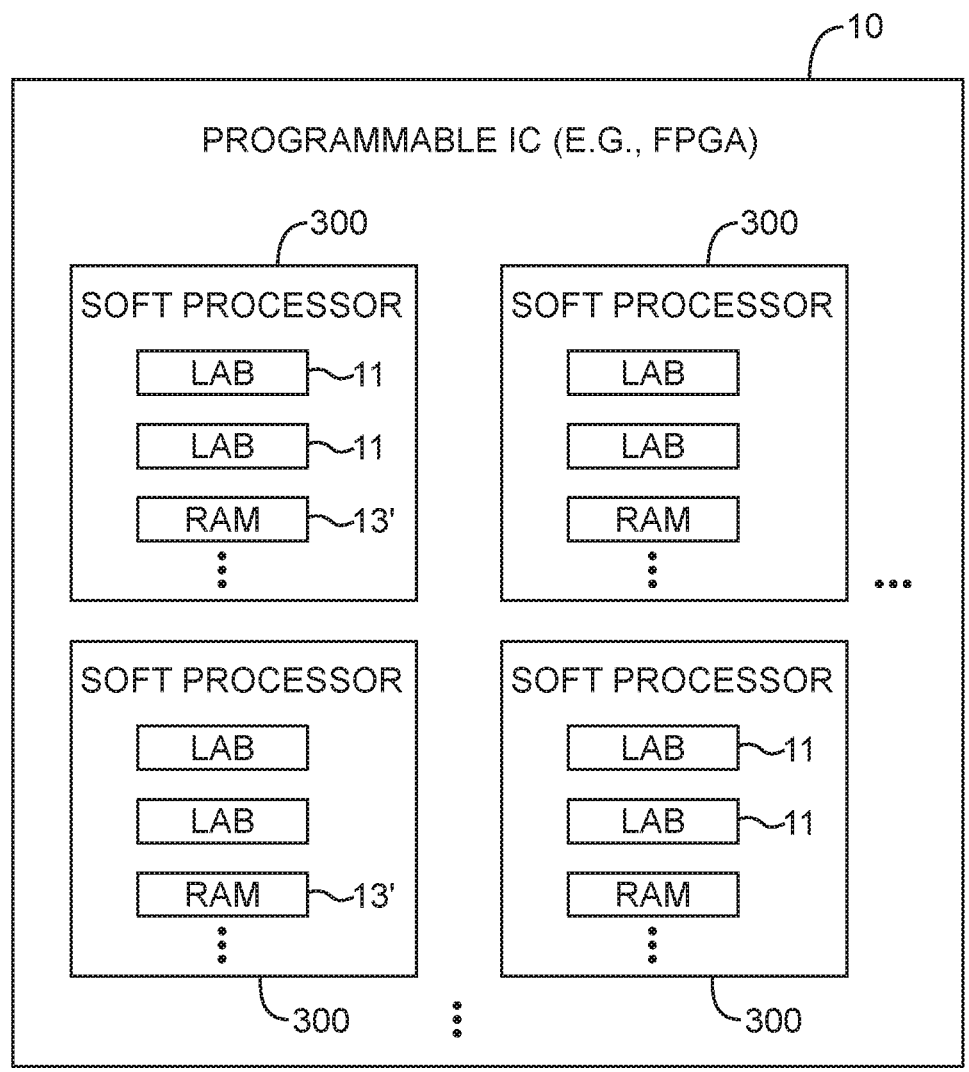
FIG. 3 is a diagram showing how a programmable integrated circuit may include multiple soft processors in accordance with an embodiment.

FIG. 3 is a diagram showing how programmable integrated circuit 10 (e.g., a field-programmable gate array or FPGA) may include multiple soft processors 300 in accordance with an embodiment. Each soft processor 300 (sometimes referred to as a softcore microprocessor or a soft processor core) may be a programmable/reconfigurable microprocessor core than can be wholly implemented using logic synthesis. An example of soft processor 300 may be the Nios® family of soft processors developed by Intel Corporation.

As shown in FIG. 3, each soft processor 300 may include multiple LABs 11 and one or more associated RAM blocks 13'. RAM block 13' may be a single or multiport synchronous random-access memory (RAM) block that can be used for storing processor code, implementing lookup schemes, or implementing large memory applications. The example of FIG. 3 in which FPGA 10 includes four soft processors 300 and where each soft processor 300 includes 2 LABs 11 and one RAM block 13' is merely illustrative. In general, device 10 may include any suitable number of soft processors 300 (e.g., tens, hundreds, or even thousands of soft processors), and each soft processor 300 may include at least two LABs, at least four LABs, at least eight LABs, more than 10 LABs, and any suitable number of associated RAM blocks each of which has the capacity to store thousands or millions of data bits.

Figure 4:
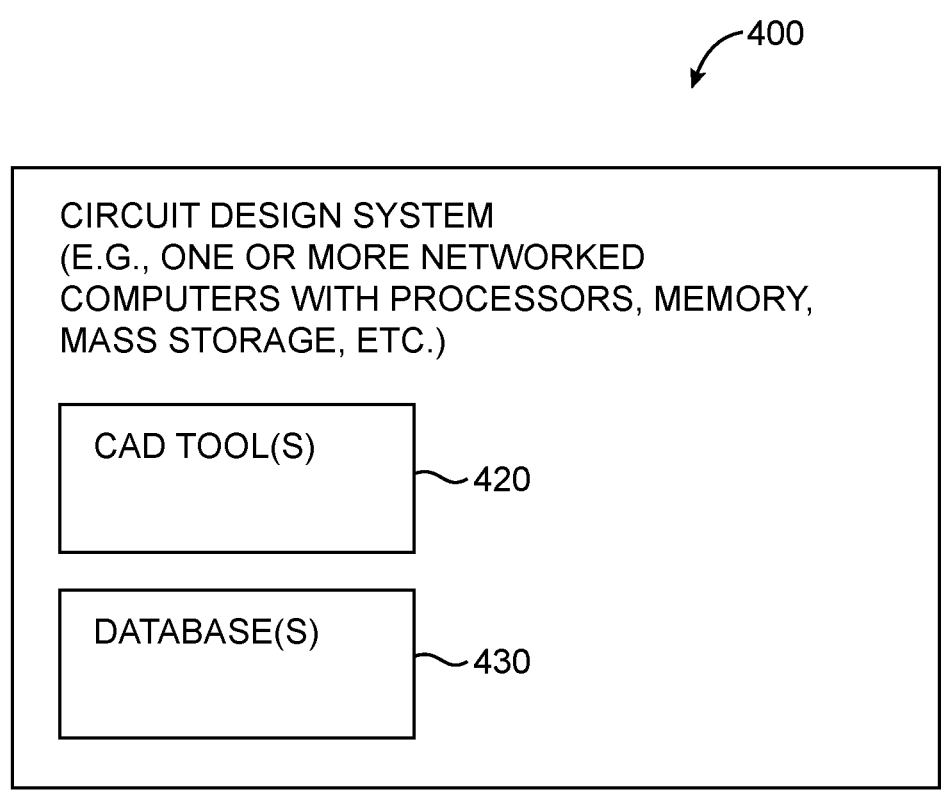
FIG. 4 is a diagram of an illustrative circuit design system that can be used to design integrated circuits in accordance with an embodiment.

Programmable integrated circuit device 10 may be designed using a circuit design system. An illustrative circuit design system 400 is shown in FIG. 4. Circuit design system 400 may be implemented on integrated circuit design computing equipment. For example, system 400 may be based on one or more processors such as personal computers, workstations, etc. The processor(s) may be linked using a network (e.g., a local or wide area network). Memory in these computers or external memory and storage devices such as internal and/or external hard disks or non-transitory computer-read storage media may be used to store instructions and data.

Software-based components such as computer-aided design tools 420 and databases 430 reside on system 400. During operation, executable software such as the software of computer aided design tools 420 runs on the processor(s) of system 400. Databases 430 are used to store data for the operation of system 400. The software may sometimes be referred to as software code, data, program instructions, instructions, script, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s). Software stored on the non-transitory computer readable storage media may be executed on system 400. When the software of system 400 is installed, the storage of system 400 has instructions and data that cause the computing equipment in system 400 to execute various methods (processes). When performing these processes, the computing equipment is configured to implement the functions of circuit design system 400.

The computer aided design (CAD) tools 420, some or all of which are sometimes referred to collectively as a CAD tool, a circuit design tool, or an electronic design automation (EDA) tool, may be provided by a single vendor or by multiple vendors. Tools 420 may be provided as one or more suites of tools (e.g., a compiler suite for performing tasks associated with implementing a circuit design in a programmable logic device) and/or as one or more separate software components (tools). Database(s) 430 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 5:
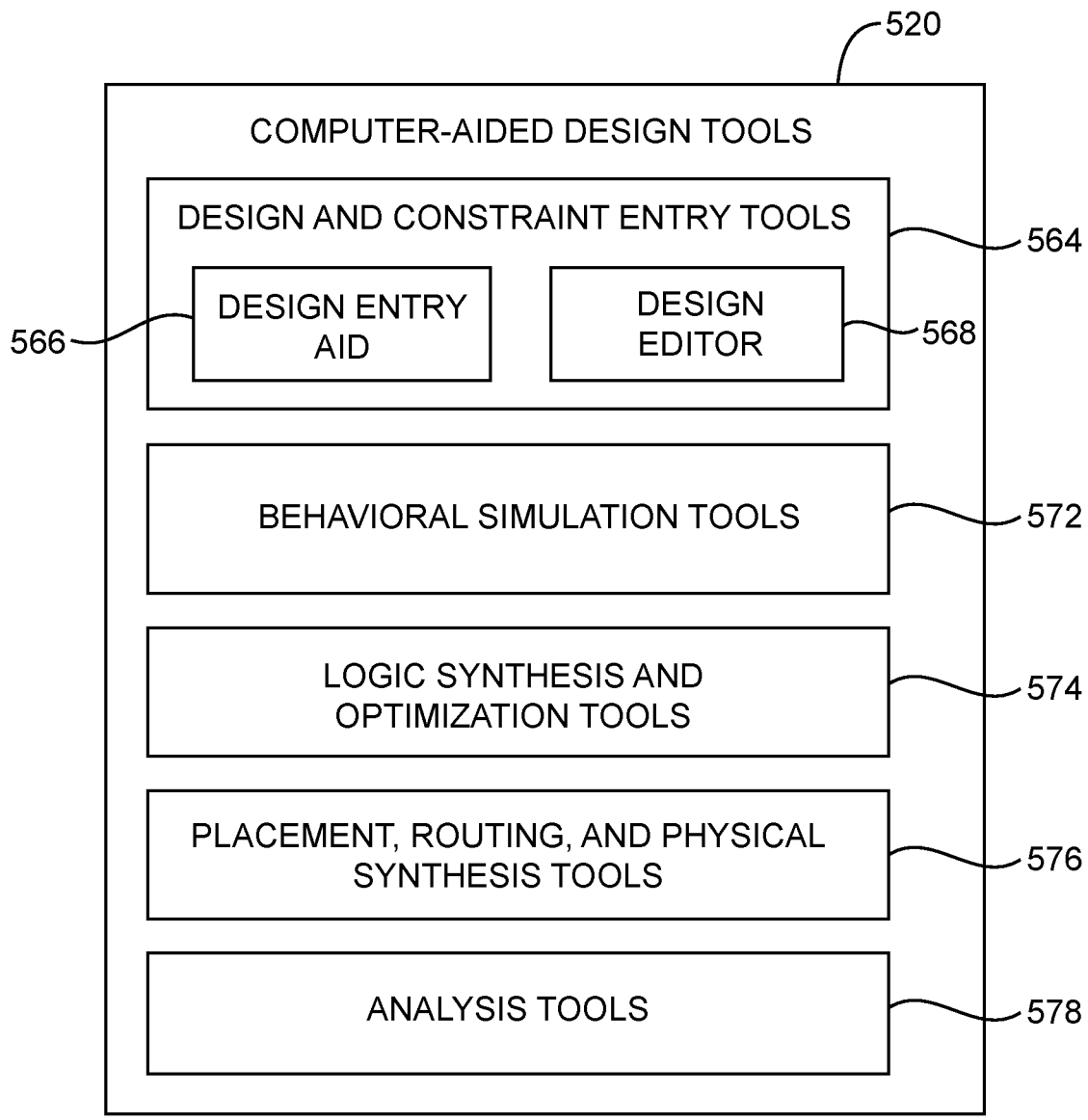
FIG. 5 is a diagram of illustrative computer-aided design (CAD) tools that may be used in a circuit design system in accordance with an embodiment.

Illustrative computer aided design tools 520 that may be used in a circuit design system such as circuit design system 400 of FIG. 4 are shown in FIG. 5. The design process may start with the formulation of functional specifications of the integrated circuit design (e.g., a functional or behavioral description of the integrated circuit design). A circuit designer may specify the functional operation of a desired circuit design using design and constraint entry tools 564. Design and constraint entry tools 564 may include tools such as design and constraint entry aid 566 and design editor 568. Design and constraint entry aids such as aid 566 may be used to help a circuit designer locate a desired design from a library of existing circuit designs and may provide computer-aided assistance to the circuit designer for entering (specifying) the desired circuit design.

As an example, design and constraint entry aid 566 may be used to present screens of options for a user. The user may click on on-screen options to select whether the circuit being designed should have certain features. Design editor 568 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 564 may be used to allow a circuit designer to provide a desired circuit design using any suitable format. For example, design and constraint entry tools 564 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 564 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 564 may allow the circuit designer to provide a circuit design to the circuit design system 400 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 568. Blocks of code may be imported from user-maintained or commercial libraries if desired.

After the design has been entered using design and constraint entry tools 564, behavioral simulation tools 572 may be used to simulate the functional performance of the circuit design. If the functional performance of the design is incomplete or incorrect, the circuit designer can make changes to the circuit design using design and constraint entry tools 564. The functional operation of the new circuit design may be verified using behavioral simulation tools 572 before synthesis operations have been performed using tools 574. Simulation tools such as behavioral simulation tools 572 may also be used at other stages in the design flow if desired (e.g., after logic synthesis). The output of the behavioral simulation tools 572 may be provided to the circuit designer in any suitable format (e.g., truth tables, timing diagrams, etc.).

Once the functional operation of the circuit design has been determined to be satisfactory, logic synthesis and optimization tools 574 may generate a gate-level netlist of the circuit design, for example using gates from a particular library pertaining to a targeted process supported by a foundry, which has been selected to produce the integrated circuit. Alternatively, logic synthesis and optimization tools 574 may generate a gate-level netlist of the circuit design using gates of a targeted programmable logic device (i.e., in the logic and interconnect resources of a particular programmable logic device product or product family).

Logic synthesis and optimization tools 574 may optimize the design by making appropriate selections of hardware to implement different logic functions in the circuit design based on the circuit design data and constraint data entered by the logic designer using tools 564. As an example, logic synthesis and optimization tools 574 may perform multi-level logic optimization and technology mapping based on the length of a combinational path between registers in the circuit design and corresponding timing constraints that were entered by the logic designer using tools 564.

After logic synthesis and optimization using tools 574, the circuit design system may use tools such as placement, routing, and physical synthesis tools 576 to perform physical design steps (layout synthesis operations). Tools 576 can be used to determine where to place each gate of the gate-level netlist produced by tools 574. For example, if two counters interact with each other, tools 576 may locate these counters in adjacent regions to reduce interconnect delays or to satisfy timing requirements specifying the maximum permitted interconnect delay. Tools 576 create orderly and efficient implementations of circuit designs for any targeted integrated circuit (e.g., for a given programmable integrated circuit such as a field-programmable gate array (FPGA)).

Tools such as tools 574 and 576 may be part of a compiler suite (e.g., part of a suite of compiler tools provided by a programmable logic device vendor). In certain embodiments, tools such as tools 574, 576, and 578 may also include timing analysis tools such as timing estimators. This allows tools 574 and 576 to satisfy performance requirements (e.g., timing requirements) before actually producing the integrated circuit.

After an implementation of the desired circuit design has been generated using tools 576, the implementation of the design may be analyzed and tested using analysis tools 578. For example, analysis tools 578 may include timing analysis tools, power analysis tools, or formal verification tools, just to name few.

After satisfactory optimization operations have been completed using tools 520 and depending on the targeted integrated circuit technology, tools 520 may produce a mask-level layout description of the integrated circuit or configuration data for programming the programmable logic device.

As described above in the Background section, one common issue with designing an FPGA is that most designs are not able to utilize all of the logic resources on the FPGA (i.e., there is a limit as to how much design can "pack" the available logic resources). For example, arithmetic logic typically packs up to 70% of all available arithmetic resources, whereas random logic can pack up to 85% of all available resources. As the FPGA is very expensive on a function basis compared to an application-specific integrated circuit (ASIC), this inefficiency is costly for the user. Another issue is that the actual utilization percentage is unknown until much later in the design cycle, which might result in a scenario in which a device is first chosen only to find that it has insufficient resources somewhere down the road. Moreover, the designs are not deterministic. Even though the overall design size might be roughly the same from one compile to another, the speed for each compiled design might vary significantly (e.g., by more than 1%, by more than 5%, by more than 10%, etc.) even if only a small portion of the design changes.

Recently, a method called fractal synthesis that finds a solution for arithmetic datapaths has been introduced. This is done iteratively via several synthesis and re-synthesis operations, clustering, and packing. Although multiple iterations are needed, each iteration can be very fast. Fractal synthesis can increase arithmetic density from 70% up to 99%. Increasing arithmetic utilization/packing in this way may be very important for computationally intensive applications such as artificial intelligence (AI) networks. An analogous solution is needed for increasing the packing of random logic, but packing random logic presents a very different technical problem with a very different solution space. One problem associated with the clustering and packing during fractal synthesis is that it is difficult to obtain a global solution.

In accordance with an embodiment, methods are provided for increasing the random logic utilization density while improving device performance. The methods assume that finding a global solution or optimization is difficult (or impossible. Instead, the methods first identify a relatively local solution, and then expands it to the rest of the device. A smaller search space means that in some cases, existing tools and algorithms can be leveraged to find good solutions. At the device level, the existing design flow need not be modified, but good local solutions can be reused or imported to other locations on the device. Oftentimes, there are hierarchical components in a design that are repeated/replicated many times. Simple replication of one small fixed area, however, does not always work as an FPGA is not completely homogeneous (i.e., there may be random or unpredictable discontinuities between different similar circuit blocks).

Figure 6:
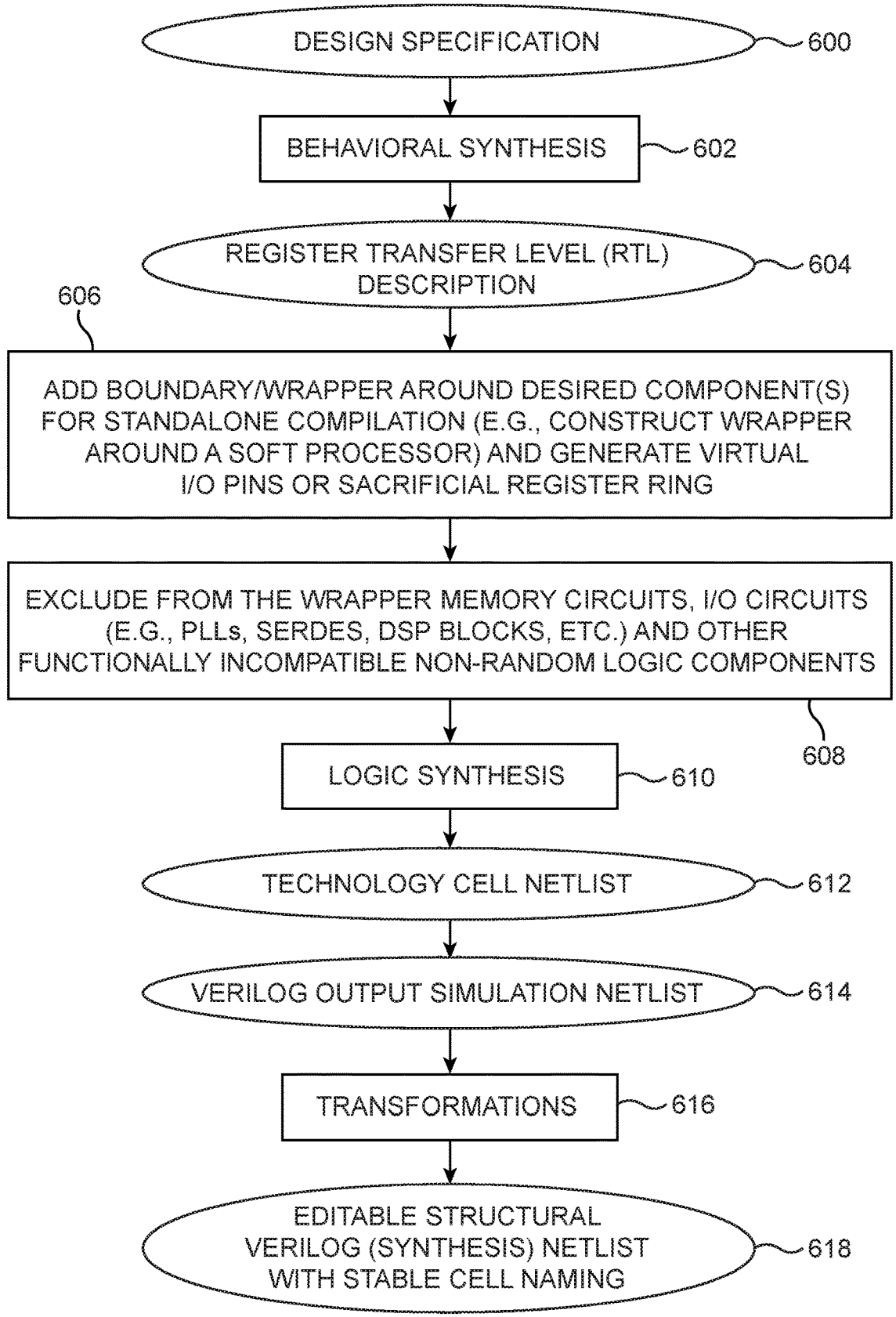
FIG. 6 is a flow chart of illustrative steps for locking down cell names in a synthesis netlist in accordance with an embodiment.

These methods may involve (i) locking down cell naming in a synthesis netlist, (ii) obtaining location solution files for only selected regions of interest, (iii) reassembling a design with the best solutions by importing to compatible locations, and/or (iv) optionally locking the location solution files to the LAB level. FIG. 6 is a flow chart of illustrative steps for locking down all cell names in a synthesis netlist. In order for subsequent location and routing assignments to reliably find their targets, cell names (e.g., names or identifiers for logic cells 34 in FIG. 2) need to be predictable and unique. By locking cells down to a certain format, any redundancy or unused part of the cell may also be locked in. This gross redundancy may be dealt at a higher level, which is not the subject of this disclosure.

As shown in FIG. 6, a circuit designer may first provide a design specification 600 to the CAD tools (e.g., CAD tools 420 in FIG. 4 or CAD tools 520 in FIG. 5). The design specification 600 may, in general, be a behavioral description provided in the form of an application code (e.g., C code, C++ code, SystemC code, OpenCL code, etc.). In some scenarios, the design specification may be provided in the form of a register transfer level (RTL) description 604.

The RTL description may have any form of describing circuit functions at the register transfer level. For example, the RTL description may be provided using a hardware description language such as the Verilog hardware description language (Verilog HDL or Verilog), the SystemVerilog hardware description language (SystemVerilog HDL or SystemVerilog), or the Very High Speed Integrated Circuit Hardware Description Language (VHDL).

In general, the behavioral design specification 600 may include untimed or partially timed functional code (i.e., the application code does not describe cycle-by-cycle hardware behavior), whereas the RTL description 604 may include a fully timed design description that details the cycle-by-cycle behavior of the circuit at the register transfer level. Design specification 600 or RTL description 604 may also include target criteria such as area use, power consumption, delay minimization, clock frequency optimization, or any combination thereof. The optimization constraints and target criteria may be collectively referred to as "constraints." These constraints can be provided for individual data paths, portions of individual data paths, portions of a design, or for the entire design. For example, the constraints may be provided with the design specification 600, the RTL description 604 (e.g., as a pragma or as an assertion), in a constraint file, or through user input (e.g., using the design and constraint entry tools 564 of FIG. 5), to name a few.

At step 602, behavioral synthesis (sometimes also referred to as algorithmic synthesis) may be performed to convert the behavioral description 600 into an RTL description 604. Step 602 may be skipped if the design specification is already provided in form of an RTL description.

At step 606, the design tools may build a "wrapper" or "boundary" around the desired component(s) for standalone compilation. As an example, a boundary may be formed around a soft processor core (see, e.g., soft processor 300 in FIG. 3). This wrapper can, for example, be selected by a synthesis attribute. The logic synthesis tools (e.g., tools 574 in FIG. 5) may pull out the component and automatically generate virtual input-output (I/O) pins around it. In tools lacking virtual pins, a sacrificial register ring may be used instead to physically separate the core from the I/O. Methods in which a wrapper is constructed around a soft processor are sometimes described herein as an example. This is, however, merely illustrative. If desired, wrappers or boundaries may be constructed around any one or group of standalone logic components such as a LAB, a logic cell or ALM, a portion of a logic cell such as one or more LUTs, one or more registers, one or more logic gates, or any desired collection of logic circuits.

At step 608, the design tools may carve out exclusions from the wrapper. For example, memory circuits, I/O circuits such as phase-locked loops and serializer/deserializer circuits, DSP blocks, and/or other types of non-random logic circuits that are functionally incompatible with the wrapped logic component or that have very different simulation constructs may be excluded from the wrapper.

At step 610, the logic synthesis tools may receive the RTL description with the wrappers and exclusions and perform logic synthesis (i.e., a first step of the compile process) to produce a corresponding technology cell netlist 612. Netlist 612 enumerates the design in terms of logic (ALM) cells, which are the native logic building block of an FPGA and are synonymous with "technology cells." Since the ALM logic cells (e.g., cells 34 of FIG. 2) are the native element for implementing logic gates, technology cell netlist 612 is sometimes referred to as a gate-level netlist.

Technology cell netlist 612 may be dumped to a Verilog output (VO) simulation netlist 614 (as an example) or other suitable format for the purposes of ingestion by simulation tools. The VO simulation netlist 614 is a cell netlist in Verilog format, but with some annotations about the cell behavior and names which are in the simulator's dialect. Netlist 614 does not need any further transformation to simulate.

Transformation 616 may be necessary to convert netlist 614 back to a format suitable for re-entering logic synthesis, albeit now with stable cell naming across the entire netlist. The transformation may undo, remove, or simplify a variety a special characters and parameter expressions that are simulation specific but are unsuitable for getting back into synthesis. Transformation 616 will produce a corresponding editable structural Verilog netlist 618 with stable cell naming that is suitable for synthesis. At this point, the cell names will no longer change (i.e., the cell names will be consistent from synthesis to synthesis) and are each uniquely identifiable to the designer.

Once the structural synthesis netlist 618 with stable naming has been locked down, netlist 618 may be back annotated to lock down the location of a logic component, routing, pin assignments, etc. Conventional back annotation is applied to the entire circuit design, which is not helpful to the iterative packing methodology. In addition to back annotating the entire design, only selected regions/areas of interest delineated by the boundaries or wrappers described in connection with FIG. 6 may be extracted from the netlist so that several or many parallel back annotation solutions can be pulled out from the netlist. These bounded annotations may be saved in a file sometimes referred to herein as a "location solution" (or LOCSOL) file.

Figure 7:
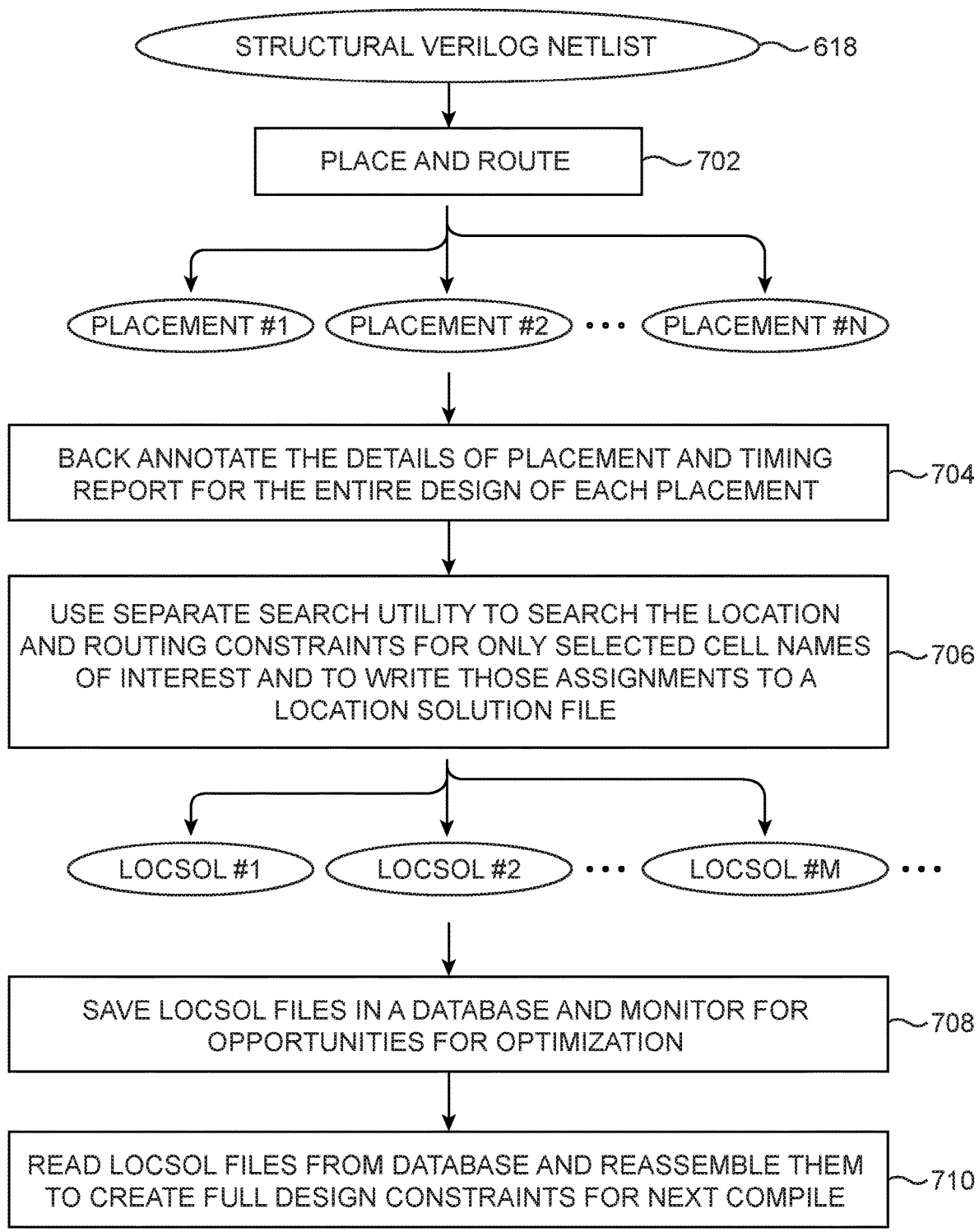
FIG. 7 is a flow chart of illustrative steps for obtaining location solution (LOCSOL) files for use in creating full design constraints in accordance with an embodiment.

FIG. 7 is a flow chart of illustrative steps for obtaining location solution (LOCSOL) files for use in creating full design constraints. At step 702, the design tools such as tools 576 of FIG. 5 may perform a procedure called clustering, which gathers whole and fractional logic cells 34 together into LABs and then tools 576 will place and route the LABs (i.e., a second step of the compile process) according to various cost functions to create a desired final placement. Many different seeds can be used to create N corresponding satisfactory or candidate placement results (e.g., placement #1, placement #2, . . . , placement #N).

At step 704, the design tools may back annotate the placement details and the timing report for the entire design for each of the N good placements. At step 706, a separate search utility within the design tools may be used to search and identify the location and routing constraints for only the selected cell names (which should have been previously locked down using the steps shown in FIG. 6) within the "wrapped" regions of interest and to write those assignments to a corresponding LOCSOL file. In other words, a LOCSOL file may save a prior place and route result for the bounded section(s) of interest. There may be one LOCSOL file for each region of interest (see, e.g., LOCSOL file #1, LOCSOL file #2, . . . , LOCSOL file #M, etc.).

At step 708, the LOCSOL files may be saved in a database (see, e.g., database 430 in FIG. 4), and the design tools may continuously monitor these LOCSOL files to identify opportunities for optimization. For example, when the design tools are looking for a solution with better area savings, the tools will check if the latest generated LOCSOL file has fewer clusters than the best saved result in the database.

At step 710, the design tools may read the LOCSOL files from the database and reassemble them to create full design constraints for the next compile (e.g., for the next logic synthesis and place and route operations), assuming an array of many similar blacks are needed.

FIG. 8 is a diagram of an illustrative LOCSOL file 800 for a soft processor core in accordance with an embodiment. In other words, the region of interest is delineated by the boundaries of a soft processor. As shown in FIG. 8, portion 802 lists a timing slack amount (i.e., an amount of timing margin), portion 804 lists location constraints, and portion 806 lists routing constraints.

For example, the first location constraint in portion 804 assigns a flip-flop (FF) circuit with the name "nios_0|_ext_addr_r_0" (see label 810) at location (X=190, Y=9) (see label 812). As another example, the second location constraints assigned another FF with the name "nios_0|_ext_addr_r_1" at location (X=190, Y=10). In contrast, the first routing constraint in portion 806 specifies how a signal with the name "nios_0_sched0_storing" originates at an output port of the LAB at location (X=190, Y=13) on port C0_7 to deliver that signal to a destination technology cell named "_sched0_i147" while additionally driving other cells within that destination LAB. Although this example illustrates a relatively short routing connection, any routing path within the programmable device can be described using such format.

The example of FIG. 8 in which LOCSOL file 800 is associated with a given soft processor is merely illustrative and is not intended to limit the scope of the present embodiments. If desired, a LOCSOL file may be generated at other levels of granularity such as for a given LAB, a given ALM logic cell, any suitable collection of LABs, any suitable collection of logic cells, any collection of soft processors, or any group of random logic elements.

Figure 9:
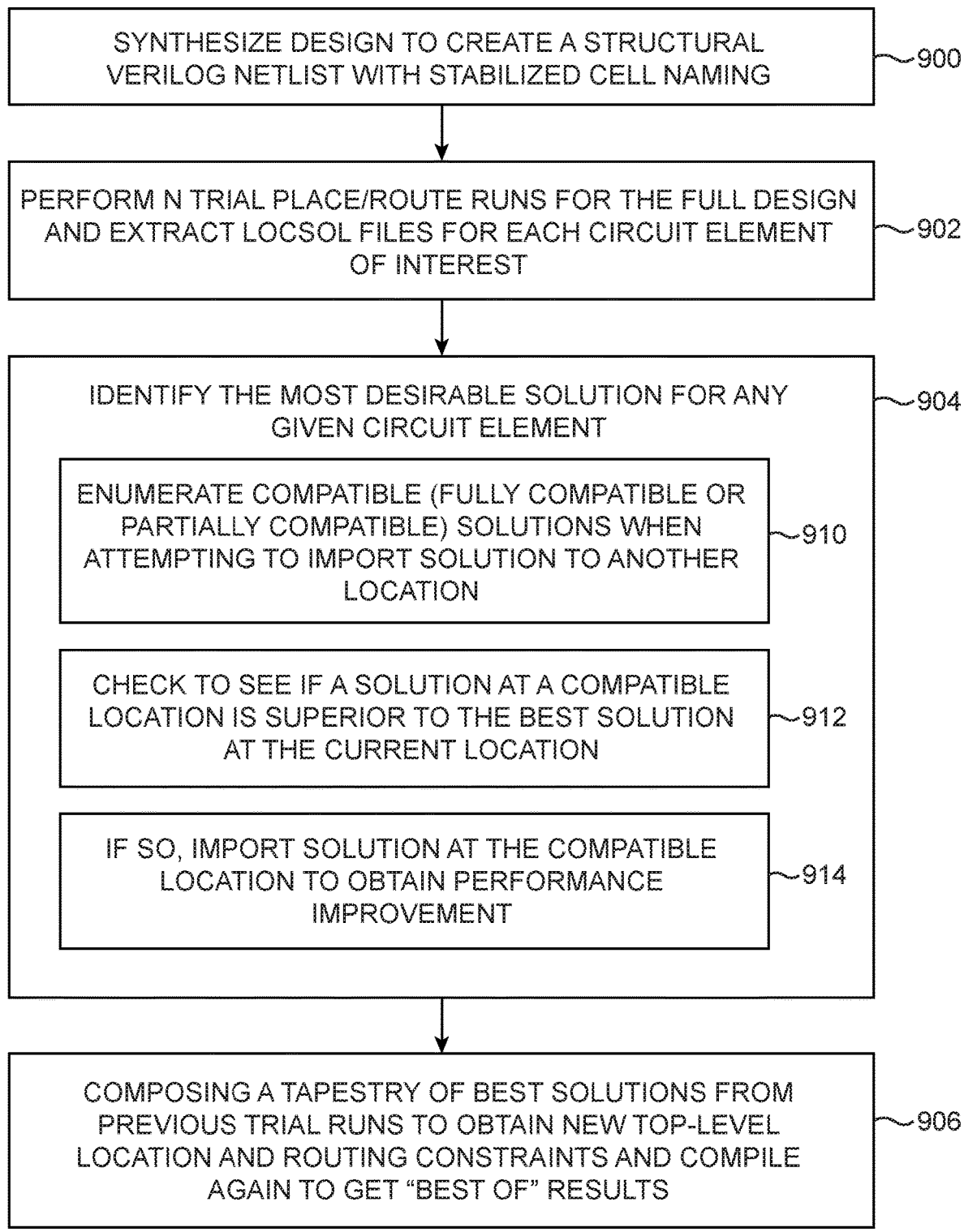
FIG. 9 is a flow chart of illustrative steps for creating a repeated array of the same circuit block by composing a tapestry of "best of" solutions from previous trial runs in accordance with an embodiment.

FIG. 9 is a flow chart of illustrative steps for creating a repeated array of the same circuit block by composing a tapestry of "best of" solutions from previous trial runs in accordance with an embodiment. At step 900, the design tools may synthesize a design to create a structural Verilog netlist with stabilized/predictable cell naming (e.g., using exemplary steps of FIG. 6).

At step 902, the place and route tools may perform N randomized trial place and route runs for the full design and extract LOCSOL files for each logic circuit element of interest (e.g., for one or more designated soft processors on the programmable integrated circuit) using the exemplary steps 702-708 of FIG. 7.

At step 904, the design tools may identify the most desirable solution or subset of solutions for any given logic circuit element. At sub-step 910, the design tools may enumerate all compatible (i.e., fully compatible or partially compatible) solutions when attempting to import a solution to another location. As described above, the FPGA logic fabric is somewhat regular but not completely homogeneous. In some cases, it is possible to take a desirable solution at one location and import it at another location. This may involve changing the X-Y coordinates by a fixed offset, editing the cell names for the new instance (e.g., nios_0 in the example of FIG. 8 may become nios_3), and also error checking.

Figure 10A:
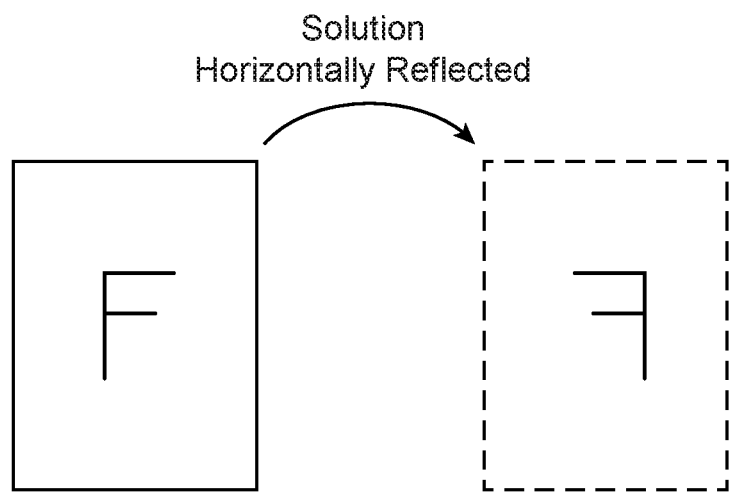
FIG. 10A is a diagram showing how one cell location can be horizontally reflected in accordance with an embodiment.
Figure 10B:
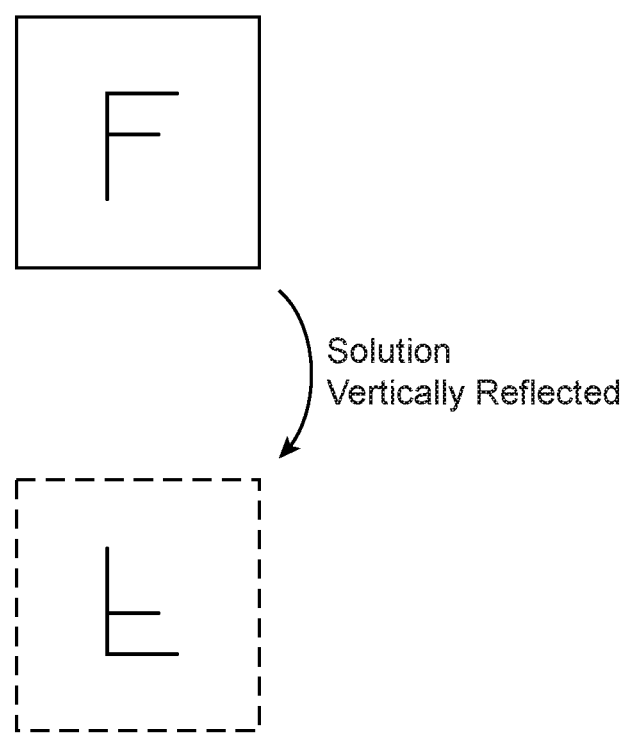
FIG. 10B is a diagram showing how one cell location can be vertically reflected in accordance with an embodiment.

There are several possibilities when attempting to move a solution to a different location. If the solution is completely compatible, the cell location and routing constraints can be imported with appropriate X-Y offsets. Relocating a location solution to another XY location may involve copying and renaming the previously stabilized name of the location solution being relocated. For instance, a previously stabilized name of a soft processor can be edited/renamed to a new stabilized name when importing it to a different location. If a direct import is not possible, there are ways to adjust the assignments so that the solution will fit. For instance, if the solution is only partially compatible, the cell locations can be imported, but the routing constraints may not be suitable for reuse. Another type of partial compatibility is when only some cell locations can be imported but not others. FIG. 10A illustrates yet another type of compatibility where cell locations can be imported with the X-coordinates negated (see how solution is horizontally reflected). FIG. 10B illustrates yet another type of compatibility where cell locations can be imported with the Y-coordinates negated (see how solution is vertically reflected). An import is impossible when the solution is completely incompatible at the new location.

In general, only the most desirable solution or subset of solutions may be retained for any given logic element. Thus, at sub-step 912, the design tools may check to see if a solution at a compatible (i.e., fully compatible or partially compatible) location is superior to the best solution at the current location. If the solution at the compatible location is indeed superior to the best solution at the current location, the better solution at the compatible location will be imported to the current location to obtain a performance improvement (sub-step 914). This process can help achieve a speed boost of 20% or more on certain computation intensive applications.

In certain situations, a particular solution may be incompatible with the surrounding neighboring components. For example, two physically close solutions may want the same routing resources and will therefore collide with each other. In such scenarios, one of the solutions may be "released" and rerouted using other routing resources.

At step 906, the design tools may then compose a tapestry or collection of best solutions from all previous place/route runs to obtain new top-level location and routing constraints and then compile again to get the "best of" results. This is done so by retaining only the most desirable solution for each circuit element of interest using the process spelled out in step 904. For example, consider a scenario in which an FPGA has 400 soft processors and the design tools perform 10 trial place/route runs (N=10). Assume that soft processor #135 is incompatible with the remaining 399 soft processors, but that soft processors #201-400 are all compatible with one another. In this scenario, the design tools will identify a "best of 10" solution for soft processor #135 but will identify a "best of 2000" (i.e., 10*200) solution for soft processors #201-400.

In accordance with another suitable embodiment not mutually exclusive with the embodiments described in connection with FIGS. 6-10, the location solution (LOCSOL) files may be locked to the LAB level such that the LABs cannot be split apart by the tools. Grouping logic cells into LAB clusters will help fix the LAB area, stabilize the LAB performance as the FPGA becomes full (e.g., in the 80% to 100 packing range), and significantly reduce compile times due to the reduction of the search space.

In general, there are two ways for expressing a technology cell (i.e., an ALM logic cell) in Verilog. An older "what you see is what you get" (WYSIWYG) cell netlist format expresses an ALM as either a LUT output or a single arithmetic bit, which is typically represented using one or two WYSIWYG gates. There are also some amorphous functions which can be expressed in the logic cell which are unexpressable in the abstract halves. WYSIWYG cells can sometimes be considered as logical/abstract entities and are subject to inspection and minimization if the logical meaning is redundant or superfluous in some way. For example, in the scenario where an ALM uses only a top half portion, the WYSIWYG format may interpret the cell has having an abstract top or bottom half with a "no comment" on the neighboring half.

A relatively newer format (sometimes referred to as "Big what you see" or BigWYS cell netlist format specifies the full connectivity of the logic cell, including both combinational logic halves (or bits of the arithmetic components) and the associated registers, the full details of the input selection (e.g., to distinguish which signals enter on which physical input ports), and/or even the carry chain. The BigWYS cell can be used to express physical interconnections which cannot be reached by normal synthesis, the semantics of which are not questioned or evaluated by the software but are rather used to force relative placement of target logic cells. Compared to WYSIWYG cells, BigWYS cells are less flexible/abstract but are relatively more detailed/concrete with respect to the placement and routing of the various components within the logic cell. Although both formats can be used and mixed on a cell by cell basis, BigWYS cells may be technically advantageous for the purpose of reproducing more predictable results from compile to compile.

Figure 11:
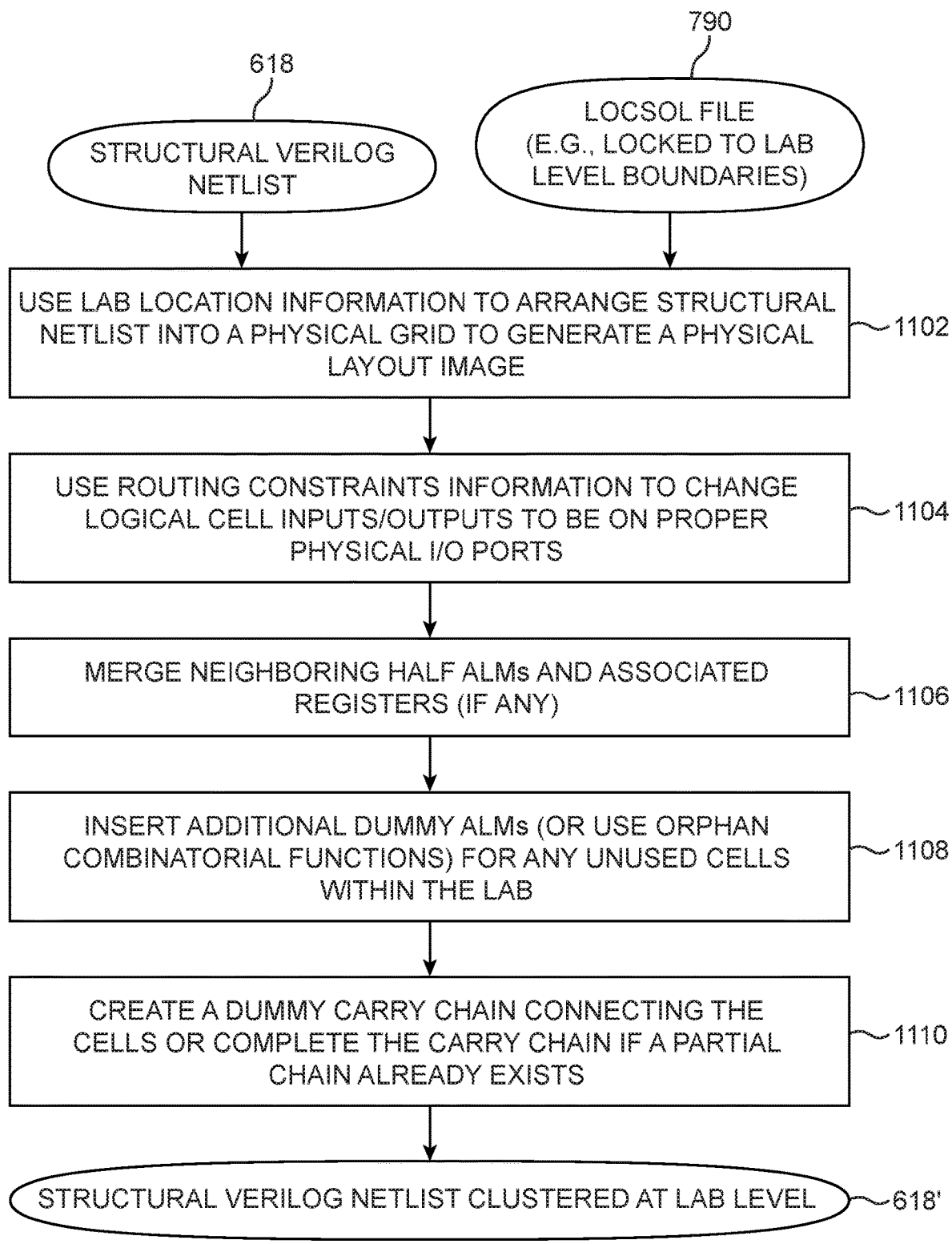
FIG. 11 is a flow chart of illustrative steps for generating a synthesis netlist that is locked to the LAB level in accordance with an embodiment.

FIG. 11 is a flow chart of illustrative steps for generating such BigWYS synthesis netlist that is locked to the LAB level, which relies on a combination of synthesis technology mapping and clustering operations. The design tools may first retrieve a structural Verilog netlist 618 with stable cell naming, which is a WYSIWYG cell netlist, and LOCSOL files that are locked to LAB level boundaries. At step 1102, the design tools may use the LAB location information in the LOCSOL files to arrange structural netlist 618 into a physical grid to generate a physical layout image.

At step 1104, the design tools may then use the routing constraints information in the LOCSOL files to change logical cell inputs and outputs to be on proper physical I/O pins. For example, a 3-input logic AND gate may use ports A, B, and C, where the final physical implementation may actually use ports B, C, and D instead to make port A available to a neighboring cell. This transformation may involve rearranging the function stored in the logic cells configuration mask as well as its connectivity.

At step 1106, any neighboring half ALM cells and associated registers may be merged with the logic cells in use, which may involve further transformation of the mask. At step 1108, additional dummy cells may be inserted for any unused logic cells within the LAB. Inserting idle dummy cells in this way will prevent some other function from occupying/stealing that hole and can therefore help enhance repeatability of the LAB. In other words, this method priorities the ability to repeat the solution precisely at the expense of burning anything unused at this stage to make it a monolithic module not capable of taking a wrong turn somewhere down the road.

At step 1110, the design tools may create a dummy carry chain connecting the different logic cells with the LAB or may complete the carry chain if a partial chain is existing already. Any inserted dummy cell will output dummy bits onto the carry chain without changing the overall functionality.

Performing these steps will yield a structural Verilog (optionally BigWYS) netlist 618' clustered at the LAB level. If desired, the WYSIWYG circuitry of the LAB can freely intermingle with amorphous logic. The place and route behavior of a section of logic containing one or more LAB WYSIWYG chains constructed in this manner may be equivalent to one full LAB of adder from a place and route point of view. No special treatment is required in synthesis or simulation flows. The only change is that a desirable clustering solution for the LAB is now required in all future place and route solutions.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is a method of forming an integrated circuit, comprising: obtaining a register transfer level (RTL) description; adding wrappers around only selected logic components of interest in the RTL description; using the RTL description to generate a corresponding synthesis netlist; performing place and route on the synthesis netlist to generate a plurality of candidate placements; back annotating location and routing constraints of the entire design for each of the plurality of candidate placements; generating location solution files by searching and identifying the location and routing constraints associated with only the selected logic components delineated by the added wrappers; and identifying best solutions among the location solution files; and configuring the integrated circuit based on the best solutions.

Example 2 is the method of example 1, wherein the synthesis netlist optionally has stable cell naming from compile to compile.

Example 3 is the method of any one of examples 1-2, wherein adding the wrappers around only the selected logic components of interest optionally comprises forming a wrapper around each soft processor of interest or around each logic array block of interest in the RTL description.

Example 4 is the method of any one of examples 1-3, wherein adding the wrappers around only the selected logic components of interest optionally comprises generating virtual input-output pins or sacrificial register rings around at least some of the selected logic components of interest.

Example 5 is the method of any one of examples 1-4, optionally further comprising: excluding non-random logic components from the wrappers.

Example 6 is the method of example 5, wherein excluding the non-random logic components from the wrappers optionally comprises excluding memory circuits and input-output circuits from the wrappers.

Example 7 is the method of any one of examples 1-6, optionally further comprising: performing logic synthesis on the RTL description to generate a technology cell netlist; and using the technology cell netlist to generate a simulation netlist that is suitable for performing simulations.

Example 8 is the method of example 7, optionally further comprising: transforming the simulation netlist into the synthesis netlist.

Example 9 is the method of any one of examples 1-8, optionally further comprising: saving the location solution files to a database while monitoring for optimization opportunities.

Example 10 is the method of example 9, optionally further comprising: reading the location solution files from the database and reassembling only the best solutions from the location solution files to obtain full design constraints for the next compile.

Example 11 is the method of any one of examples 1-10, wherein identifying the best solutions among the location solution files optionally comprises identifying compatible solutions that can be imported to a different location on the integrated circuit.

Example 12 is the method of example 11, wherein identifying the best solutions among the location solution files further optionally comprises comparing the compatible solutions associated with the different locations.

Example 13 is the method of example 12, optionally further comprising: in response to determining that a compatible solution at another location is superior to the solution at a given location, importing the compatible solution from the another location to the given location to obtain a performance improvement.

Example 14 is a method of implementing an integrated circuit, comprising: performing trial place and route operations to obtain at least a first candidate placement solution for a first location on the integrated circuit and a second candidate placement solution for a second location on the integrated circuit different from the first location; determining whether the first candidate placement solution for the first location on the integrated circuit is compatible with the second location on the integrated circuit; in response to determining that the first candidate placement solution is compatible with the second location, determining whether the first candidate placement solution is superior to the second candidate placement solution; and in response to determining that the first candidate placement solution is superior to the second candidate placement solution, importing the first candidate placement solution to the second location to obtain a performance improvement for the integrated circuit.

Example 15 is the method of example 14, optionally further comprising: maintaining predictable cell names in the first and second candidate placement solutions.

Example 16 is the method of example 15, wherein importing the first candidate placement solution to the second location optionally comprises importing placement and routing constraints with appropriate location offsets.

Example 17 is the method of any one of examples 15-16, wherein importing the first candidate placement solution to the second location optionally comprises at least partially renaming the predictable cell names in the first candidate placement solution.

Example 18 is the method of any one of examples 14-17, wherein importing the first candidate placement solution to the second location optionally comprises horizontally or vertically reflecting the first candidate placement solution.

Example 19 is a method of designing an integrated circuit, comprising: performing place and route to generate a placement result; back annotating location and routing constraints of the entire design for the placement result; generating a location solution file by extracting only a subset of the back annotated location and routing constraints; and locking the location solution file to logic block clusters to stabilize performance and reduce compile time.

Example 20 is the method of example 19, wherein a logic block optionally comprises a plurality of logic cells, and wherein locking the location solution file to the logic block clusters optionally comprises merging neighboring half logic cells.

Example 21 is the method of any one of examples 19-20, wherein a logic block optionally comprises a plurality of logic cells, and wherein locking the location solution file to the logic block clusters optionally comprises inserting dummy logic cells.

Example 22 is the method of any one of examples 19-21, wherein a logic block optionally comprises a plurality of logic cells, and wherein locking the location solution file to the logic block clusters optionally comprises inserting a dummy carry chain to connect the plurality of logic cells.

The foregoing is merely illustrative of the principles of this invention and various modifications can be made by those skilled in the art. The foregoing embodiments may be implemented individually or in any combination.

What is claimed is:

1. A method of forming an integrated circuit, comprising:
   obtaining a register transfer level (RTL) description of a design;
   adding wrappers around only selected logic components of interest in the RTL description;
   using the RTL description to generate a corresponding synthesis netlist;
   performing place and route on the synthesis netlist to generate a plurality of candidate placements;
   back annotating the synthesis netlist with location and routing constraints of an entirety of the design for each of the plurality of candidate placements;
   generating location solution files by searching and identifying the location and routing constraints associated with only the selected logic components delineated by the added wrappers;
   identifying best solutions among the location solution files; and
   configuring the integrated circuit based on the best solutions.

2. The method of claim 1, wherein the synthesis netlist has stable cell naming from compile to compile.

3. The method of claim 1, wherein adding the wrappers around only the selected logic components of interest comprises forming awrapper around each soft processor of interest or around each logic array block of interest in the RTL description.

4. The method of claim 1, wherein adding the wrappers around only the selected logic components of interest comprises generating virtual input-output pins or sacrificial register rings around at least some of the selected logic components of interest.

5. The method of claim 1, further comprising: excluding non-random logic components from the wrappers.

6. The method of claim 5, wherein excluding the non-random logic components from the wrappers comprises excluding memory circuits and input-output circuits from the wrappers.

7. The method of claim 1, further comprising: performing logic synthesis on the RTL description to generate a technology cell netlist; and using the technology cell netlist to generate a simulation netlist that is suitable for performing simulations.

8. The method of claim 7, further comprising:

transforming the simulation netlist into the synthesis netlist.

9. The method of claim 1, further comprising: saving the location solution files to a database while monitoring for optimization opportunities.

10. The method of claim 9, further comprising: reading the location solution files from the database and reassembling only the best solutions from the location solution files to obtain full design constraints for a next compile.

11. The method of claim 1, wherein identifying the best solutions among the location solution files comprises identifying compatible solutions that can be imported to a different location on the integrated circuit.

12. The method of claim 11, wherein identifying the best solutions among the location solution files further comprises comparing the compatible solutions associated with the different locations.

13. The method of claim 12, further comprising: in response to determining that a compatible solution at another location is superior to the solution at a given location, importing the compatible solution from the another location to the given location to obtain a performance improvement.

14. A method of implementing an integrated circuit, comprising:

performing trial place and route operations to obtain at least a first candidate placement solution for a first location of a plurality of locations on the integrated circuit and a second candidate placement solution for a second location of the plurality of locations on the integrated circuit different from the first location, wherein the first location is a circuit element comprising a wrapped boundary, wherein the second location is a second circuit element comprising a second wrapped boundary, and wherein a remainder of the plurality of locations are circuit elements that are not wrapped;

determining whether the first candidate placement solution for the first location on the integrated circuit is compatible with the second location on the integrated circuit;

in response to determining that the first candidate placement solution is compatible with the second location, determining whether the first candidate placement solution is superior to the second candidate placement solution; and in response to determining that the first candidate placement solution is superior to the second candidate placement solution, importing the first candidate placement solution to the second location to obtain a performance improvement for the integrated circuit.

15. The method of claim 14, further comprising: maintaining predictable cell names in the first and second candidate placement solutions.

16. The method of claim 15, wherein importing the first candidate placement solution to the second location comprises importing placement and routing constraints with appropriate location offsets.

17. The method of claim 15, wherein importing the first candidate placement solution to the second location comprises at least partially renaming the predictable cell names in the first candidate placement solution.

18. The method of claim 14, wherein importing the first candidate placement solution to the second location comprises horizontally or vertically reflecting the first candidate placement solution.

* * * * *